United States Patent
Nie (10) Patent No.: US 9,780,118 B2
(45) Date of Patent: Oct. 3, 2017

(54) DISPLAY PANEL AND A MANUFACTURING METHOD THEREOF

(71) Applicant: Shenzhen China Star Optoelectronics Technology Co., Ltd., Shenzhen, Guangdong (CN)

(72) Inventor: Chenglei Nie, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 259 days.

(21) Appl. No.: 14/407,938

(22) PCT Filed: Nov. 25, 2014

(86) PCT No.: PCT/CN2014/092125
§ 371 (c)(1),
(2) Date: Dec. 12, 2014

(87) PCT Pub. No.: WO2016/078101
PCT Pub. Date: May 26, 2016

(65) Prior Publication Data
US 2016/0351593 A1    Dec. 1, 2016

(30) Foreign Application Priority Data
Nov. 18, 2014  (CN) .......................... 2014 1 0660210

(51) Int. Cl.
*H01L 27/12*  (2006.01)
*H05K 1/02*  (2006.01)
(Continued)

(52) U.S. Cl.
CPC ...... *H01L 27/1218* (2013.01); *H01L 27/1248* (2013.01); *H01L 27/1259* (2013.01);
(Continued)

(58) Field of Classification Search
CPC ......... G02F 1/133555; G02F 1/136227; G02F 1/136213; G02F 2201/40; G02F 1/13624; G02F 2001/134354; H01L 27/1255
(Continued)

(56) References Cited

U.S. PATENT DOCUMENTS

2005/0264689 A1    12/2005  Yang et al.
2007/0195238 A1*   8/2007   Kim .................. G02F 1/136227
                                                349/114
(Continued)

FOREIGN PATENT DOCUMENTS

CN        101359678 A       2/2009
CN        101763186 A       6/2010
(Continued)

*Primary Examiner* — Evan Pert
*Assistant Examiner* — Changhyun Yi
(74) *Attorney, Agent, or Firm* — Andrew C. Cheng (57) ABSTRACT

The invention discloses a display panel and a manufacturing method thereof, and the display panel comprises a first substrate and a second substrate disposing correspondingly to each other, a pixel array disposed between the first substrate and the second substrate and an electrode disposed on a first substrate surface near the second substrate, and a through hole is disposed correspondingly to the second substrate and the electrode to expose part of the electrode by passing through the through hole. By applying the above-described method, the invention can achieve embedding functional components within the display panel, furthermore save a disposing space, increase a screen portion of display panel, and then improve using experiences of users.

10 Claims, 5 Drawing Sheets

(51) Int. Cl.
  *H05K 3/40* (2006.01)
  *H05K 5/00* (2006.01)
  *H05K 1/18* (2006.01)
(52) U.S. Cl.
  CPC ........... *H05K 1/0274* (2013.01); *H05K 1/183* (2013.01); *H05K 3/4038* (2013.01); *H05K 5/0017* (2013.01); *H05K 2201/0108* (2013.01); *H05K 2201/10128* (2013.01)
(58) Field of Classification Search
  USPC .......... 349/39, 48, 114; 257/21, 59, E21.535
  See application file for complete search history.

(56) References Cited

U.S. PATENT DOCUMENTS

| | | | |
|---|---|---|---|
| 2012/0069241 A1* | 3/2012 | Shiau | G06F 1/1686 348/373 |
| 2012/0105400 A1 | 5/2012 | Mathew et al. | |
| 2014/0160348 A1 | 6/2014 | Wang et al. | |
| 2014/0225131 A1 | 8/2014 | Benson et al. | |
| 2015/0372201 A1 | 12/2015 | Xu | |

FOREIGN PATENT DOCUMENTS

| | | |
|---|---|---|
| CN | 102650763 A | 8/2012 |
| CN | 103137891 A | 6/2013 |
| CN | 103257489 A | 8/2013 |
| CN | 104133307 A | 11/2014 |
| JP | 2009175230 A | 8/2009 |

* cited by examiner

DISPLAY PANEL AND A MANUFACTURING METHOD THEREOF

FIELD OF THE INVENTION

The invention relates to a display technical field, particularly to a display panel and a manufacturing method thereof.

BACKGROUND OF THE INVENTION

Besides a surface of existing equipments like mobile phones, tablet and etc. is a display panel, there are many existing functional components, ex: buttons, speakers, cameras, and etc. However these functional components is not waivable for normal workings of equipments but occupy extra disposing space within the equipments, and due to light and thin demands of equipments like mobile phones, tablets, and etc., limited disposing space of the equipments reduces screen portions of the equipments. Therefore, providing a display panel and a manufacturing method thereof is necessary to solve the aforementioned technical problem.

SUMMARY

A main solution to a technical problem in the invention is to provide a display panel and a manufacturing method which are able to save a disposing space, increasing a screen portion of display panel, and then improving using experiences of users.

In order to solve the aforementioned technical problem, a technology solution applied in the invention is: providing a display panel, and the display panel comprises a first substrate and a second substrate disposing correspondingly to each other, a pixel array disposed between the first substrate and the second substrate and an electrode disposed on a first substrate surface near the second substrate, and a through hole is disposed correspondingly to the second substrate and the electrode to expose part of the electrode by passing through the through hole.

Wherein, the display panel further comprises a passivation layer, the passivation layer covers the electrode, and the electrode is exposed at a corresponding zone of the through hole.

Wherein, the first substrate is an array substrate, the second substrate is a transparent cover substrate, the passivation layer is disposed on the array substrate, and the pixel array is disposed on the passivation layer.

Wherein, the first substrate is a transparent cover substrate, the second substrate is an array substrate, the pixel array is disposed on the array substrate, and the passivation layer is disposed on the pixel array.

Wherein, the display panel further comprises a supporting layer between the passivation layer and the transparent cover substrate for supporting.

Wherein, the display panel further comprises a functional component, which disposed in the through hole and electrically connected with the electrode.

Wherein, the functional component is a speaker, a camera or a button.

Wherein, the display panel further comprises a first glue frame disposed along an edge of the through hole and a second glue frame disposed along an edge of the second substrate, and both the first glue frame and the second glue frame used to sealing the first substrate and the second substrate are further forming a sealing structure for sealing the pixel array.

In order to solve the aforementioned technical problem, another technology solution applied in the invention is: providing a manufacturing method of display panel, and the manufacturing method comprising: forming an electrode; forming a passivation layer on a side of the electrode, and the passivation layer covers part of the electrode to expose part of the electrode; forming an array substrate at another side of the electrode, and forming a pixel array on the passivation layer; forming a transparent cover substrate on the pixel array, a through hole is disposed correspondingly to the electrode on the transparent cover substrate, and the electrode is exposed on the passivation layer at a corresponding zone of the through hole to expose part of the electrode by passing through the through hole.

In order to solve the aforementioned technical problem, another further technology solution applied in the invention is: providing a manufacturing method of display panel, and the manufacturing method comprises: forming an array substrate, and disposing a through hole on the array substrate; forming a pixel array on the array substrate; forming a passivation layer on the pixel array; forming a supporting layer on the passivation layer; forming a transparent cover substrate and then forming an electrode on the transparent cover substrate; disposing the transparent cover substrate on the supporting layer, the passivation layer covers part of the electrode to expose part of the electrode, and the electrode is exposed on the passivation layer at a corresponding zone of the through hole to expose part of the electrode by passing through the through hole.

The advantageous effects of the invention are: the situation is different from the prior art, an electrode is disposed on a first substrate surface near the second substrate in the display panel of the invention, and a through hole is disposed corresponding to the second substrate and the electrode to expose part of the electrode by passing through the through hole, so that functional components can be disposed within the through hole and electrically connected to the electrode, and then achieving embedment of the display panel with functional components, furthermore save a disposing space, increase a screen portion of display panel, and then improve using experiences of users.

DETAILED DESCRIPTION OF THE EMBODIMENTS

Hereinafter, detailed descriptions will be set forth for the invention in conjunction with the accompanying drawings and embodiments.

Figure 1:
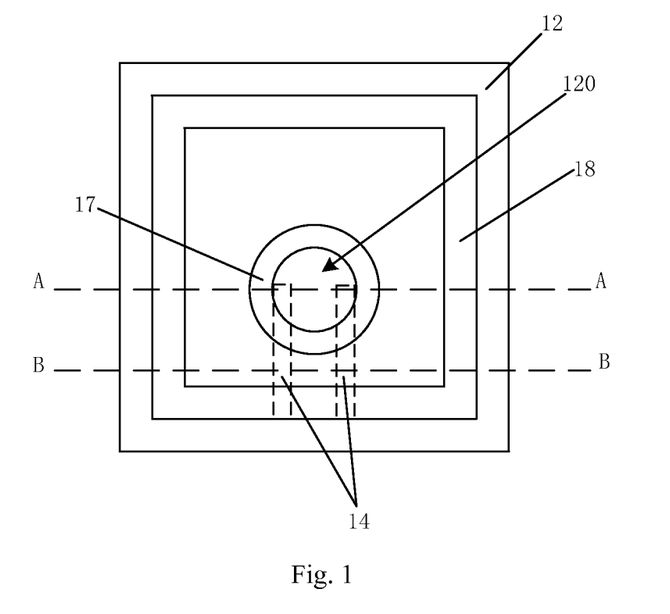
FIG. 1 is a top view of display panel of a first embodiment of the invention.
Figure 2:
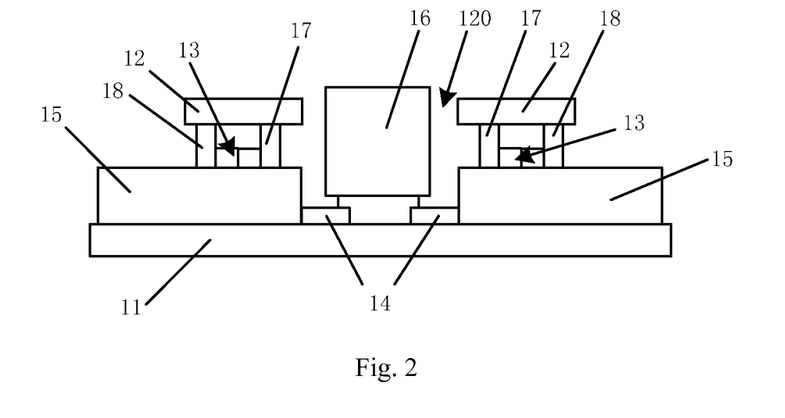
FIG. 2 is a sectional view taken along the AA direction in FIG. 1.
Figure 3:
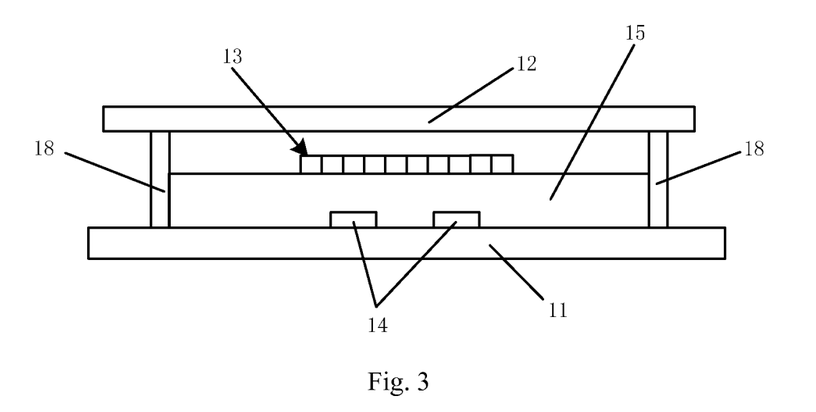
FIG. 3 is a sectional view taken along the BB direction in FIG. 1.

Please refer to FIG. 1, FIG. 2 and FIG. 3 together, FIG. 1 is a top view of display panel of a first embodiment of the invention, FIG. 2 is a sectional view taken along the AA direction in FIG. 1, and FIG. 3 is a sectional view taken along the BB direction in FIG. 1. In FIG. 1, the largest surface of the display panel and a paper surface are parallel.

In this embodiment, a display panel comprises a first substrate 11 and a second substrate 12 disposing correspondingly to each other, a pixel array 13 disposed between the first substrate 11 and the second substrate 12 and an electrode 14 disposed on a first substrate 11 surface near the second substrate 12, and a through hole 120 is disposed correspondingly to the second substrate 12 and the electrode 14 to expose part of the electrode 14 by passing through the through hole 120.

Preferably, in this embodiment, the display panel further comprises a passivation layer 15, the passivation layer 15 covers the electrode 14, and the electrode 14 is exposed at a corresponding zone of the through hole 120. Thus, the passivation layer 15 does not totally cover the electrode 14, but expose the electrode 14 at the corresponding zone of the through hole 120 to expose part of the electrode 14 by passing through the through hole 120.

Preferably, in this embodiment, the first substrate 11 is an array substrate 11, the second substrate 12 is a transparent cover substrate 12, the passivation layer 15 is disposed on the array substrate 11, and the pixel array 13 is disposed on the passivation layer 15. Preferably, both the array substrate 11 and the transparent cover substrate 12 are rectangular panels, and in other embodiments, both the array substrate 11 and the transparent cover substrate 12 can also be other shapes.

Preferably, the array substrate 11 and the transparent cover substrate 12 are parallel, so that being largest areas disposed in parallel.

Preferably, in this embodiment, the display panel further comprises a functional component 16, which disposed in the through hole 120 and electrically connected with the electrode. Preferably, the functional component 16 is a speaker, a camera or a button. In other embodiments, the functional component 16 can also be other accessories.

Preferably, in this embodiment, the display panel further comprises a first glue frame 17 disposed along an edge of the through hole 120 and a second glue frame 18 disposed along edges of the first substrate 11 and the second substrate 12, and both the first glue frame 17 and the second glue frame 18 used to sealing the first substrate 11 and the second substrate 12 are further forming a sealing structure for sealing the pixel array 13.

Preferably, a size of any one direction along a plane of the second substrate 12 i to the through hole 120s smaller than one quarter of a size of the direction along the second substrate 12. Making a disposing size of the through hole 120 occupying a smaller ratio on the display panel to utilizing a space on the display panel reasonably.

Preferably, the through hole 120 is circular, the electrode 14 is strip and the amount is two which are parallel to each other, and each edge far from each two electrodes 14 are tangent to an inner edge of the through hole 120.

Preferably, the closest distance between the edge of the through hole 120 and the edge of the second substrate 12 is smaller than one quarter of a width of the second substrate 12. Disposing the through hole 120 on the edge of the display panel, and then further arranging the space on the display panel reasonably.

Preferably, a thickness of the passivation layer 15 is larger than a thickness of the pixel array 13. Make the thickness of the passivation layer 15 larger than the thickness of the pixel array 13 to reduce capacitive coupling effects.

Figure 4:
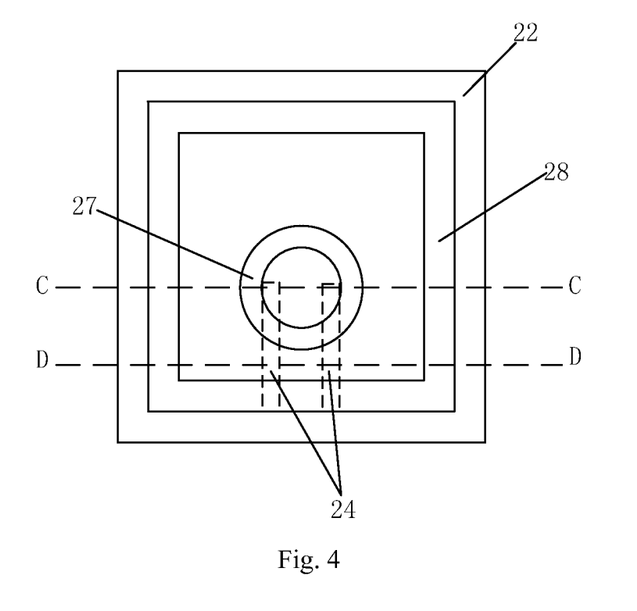
FIG. 4 is a top view of a display panel of the second embodiment of the invention.
Figure 5:
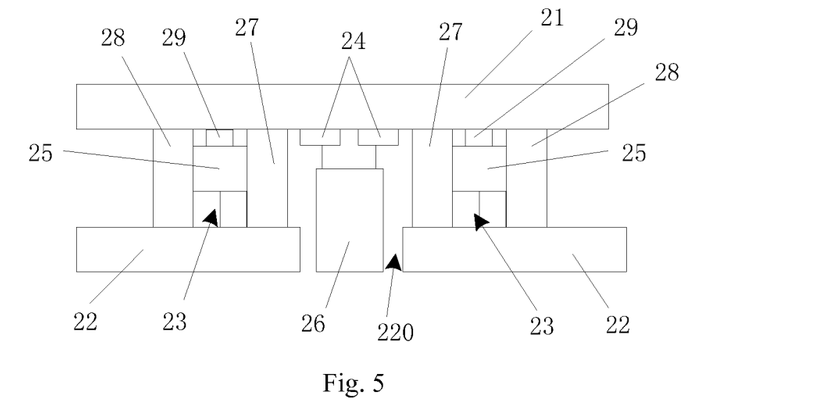
FIG. 5 is a sectional view taken along the CC direction in FIG. 4.
Figure 6:
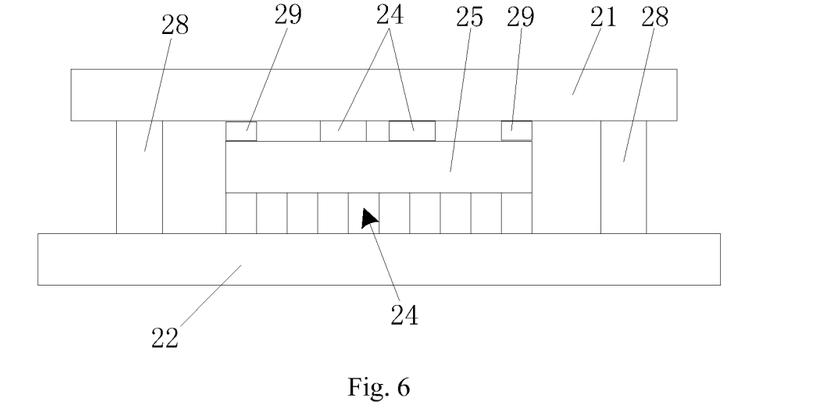
FIG. 6 is a sectional view taken along the DD direction in FIG. 4.

Please refer to FIG. 4, FIG. 5, and FIG. 6 together, FIG. 4 is a top view of a display panel of the second embodiment of the invention, FIG. 5 is a sectional view taken along the CC direction in FIG. 4, and FIG. 6 is a sectional view taken along the DD direction in FIG. 4. In FIG. 4, the largest surface of the display panel and a paper surface are parallel.

In this embodiment, a display panel comprises a first substrate 21 and a second substrate 22 disposing correspondingly to each other, a pixel array 23 disposed between the first substrate 21 and the second substrate 22 and an electrode 24 disposed on a first substrate 21 surface near the second substrate 22, and a through hole 220 is disposed correspondingly to the second substrate 22 and the electrode 24 to expose part of the electrode 24 by passing through the through hole 220.

Preferably, in this embodiment, the display panel further comprises a passivation layer 25, the passivation layer 25 covers the electrode 24, and the electrode 24 is exposed at a corresponding zone of the through hole 220. Thus, the passivation layer 25 does not totally cover the electrode 24, but expose the electrode 24 at the corresponding zone of the through hole 220 to expose part of the electrode 24 by passing through the through hole 220.

Preferably, the first substrate 21 is a transparent cover substrate 21, the second substrate 22 is an array substrate 22, the pixel array 23 is disposed on the array substrate 22, and the passivation layer 25 is disposed on the pixel array 23. Preferably, both the array substrate 22 and the transparent cover substrate 21 are rectangular panels, and in other embodiments, both the array substrate 22 and the transparent cover substrate 21 can also be other shapes. Preferably, the array substrate 22 and the transparent cover substrate 21 are parallel, so that being largest areas disposed in parallel.

Preferably, in this embodiment, the display panel further comprises a functional component 26, which disposed in the through hole 220 and electrically connected with the electrode. Preferably, the functional component is a speaker, a camera or a button. In other embodiments, the functional component 26 can also be other accessories.

Preferably, in this embodiment, the display panel further comprises a first glue frame 27 disposed along an edge of the through hole 220 and a second glue frame 28 disposed along edges of the first substrate 21 and the second substrate 22, and both the first glue frame 27 and the second glue frame 28 used to sealing the first substrate 21 and the second substrate 22 are further forming a sealing structure for sealing the pixel array 23.

Preferably, the display panel further comprises a supporting layer 29 between the passivation layer 25 and the transparent cover substrate 21 for supporting.

Preferably, a size of any one direction along a plane of the second substrate 12 to the through hole 220 is smaller than one quarter of a size of the direction along the second substrate 12. Making a disposing size of the through hole 220 occupying a smaller ratio on the display panel to utilizing a space on the display panel reasonably.

Preferably, the through hole 220 is circular, the electrode 24 is strip and the amount is two which are parallel to each other, and each edge far from each two electrodes 24 are tangent to an inner edge of the through hole 220.

Preferably, the closest distance between the edge of the through hole 220 and the edge of the second substrate 22 is smaller than one quarter of a width of the second substrate 22. Disposing the through hole 220 on the edge of the display panel, and then further arranging the space on the display panel reasonably.

Preferably, a thickness of the passivation layer 25 is larger than a thickness of the pixel array 23. Make the thickness of the passivation layer 25 larger than the thickness of the pixel array 23 to reduce capacitive coupling effects.

Figure 7:
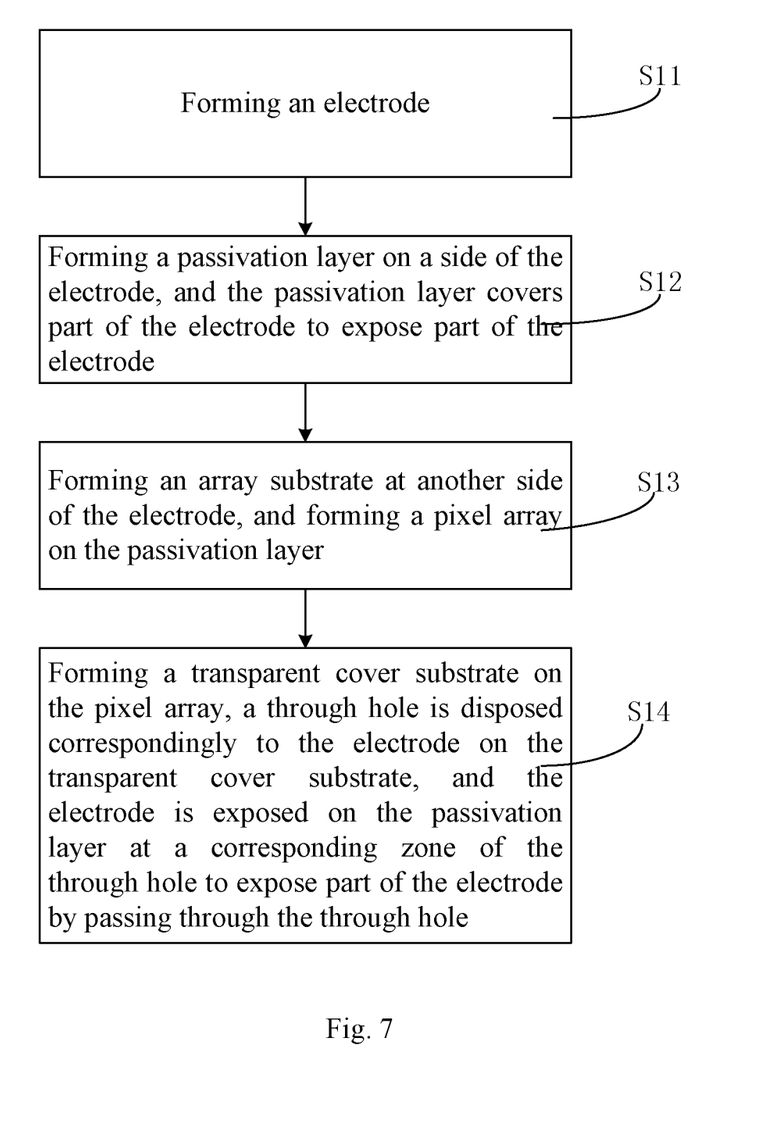
FIG. 7 is a flowchart of the first embodiment of a display panel manufacturing method of the invention.

Please refer to FIG. 7, FIG. 7 is a flowchart of the first embodiment of a display panel manufacturing method of the invention. In this embodiment, a manufacturing method of display panel comprises steps as following:

step S11: forming an electrode;
step S12: forming a passivation layer on a side of the electrode, and the passivation layer covers part of the electrode to expose part of the electrode;
step S13: forming an array substrate at another side of the electrode, and forming a pixel array on the passivation layer;
step S14: forming a transparent cover substrate on the pixel array, a through hole is disposed correspondingly to the electrode on the transparent cover substrate, and the electrode is exposed on the passivation layer at a corresponding zone of the through hole to expose part of the electrode by passing through the through hole.

In steps S11~S14, both the array substrate 11 and the transparent cover substrate 12 are rectangular panels, and in other embodiments, both the array substrate 11 and the transparent cover substrate 12 can also be other shapes. Preferably, the array substrate 11 and the transparent cover substrate 12 are parallel, so that being largest areas disposed in parallel. After step S14 further comprises: disposing a first glue frame along an edge of the through hole and disposing a second glue frame along edges of the first substrate and the second substrate, and using both the first glue frame and the second glue frame to seal the first substrate and the second substrate for further forming a sealing structure of sealing the pixel array. After step S14 further comprises: disposing a functional component in the through hole which is electrically connected with the electrode. Preferably, the functional component is a speaker, a camera or a button. In other embodiments, the functional component can also be other accessories. Preferably, a size of any one direction along a plane of the transparent cover substrate 12 to the through hole 120 is smaller than one quarter of a size of the direction along the transparent cover substrate 12. Making a disposing size of the through hole 120 occupying a smaller ratio on the display panel to utilizing a space on the display panel reasonably. Preferably, the through hole 120 is circular, the electrode 14 is strip and the amount is two which are parallel to each other, and each edge far from each two electrodes 14 are tangent to an inner edge of the through hole 120. Preferably, the closest distance between the edge of the through hole 120 and the edge of the transparent cover substrate 12 is smaller than one quarter of a width of the transparent cover substrate 12. Disposing the through hole 120 on the edge of the display panel, and then further arranging the space on the display panel reasonably. Preferably, a thickness of the passivation layer 15 is larger than a thickness of the pixel array 13. Make the thickness of the passivation layer 15 larger than the thickness of the pixel array 13 to reduce capacitive coupling effects.

Figure 8:
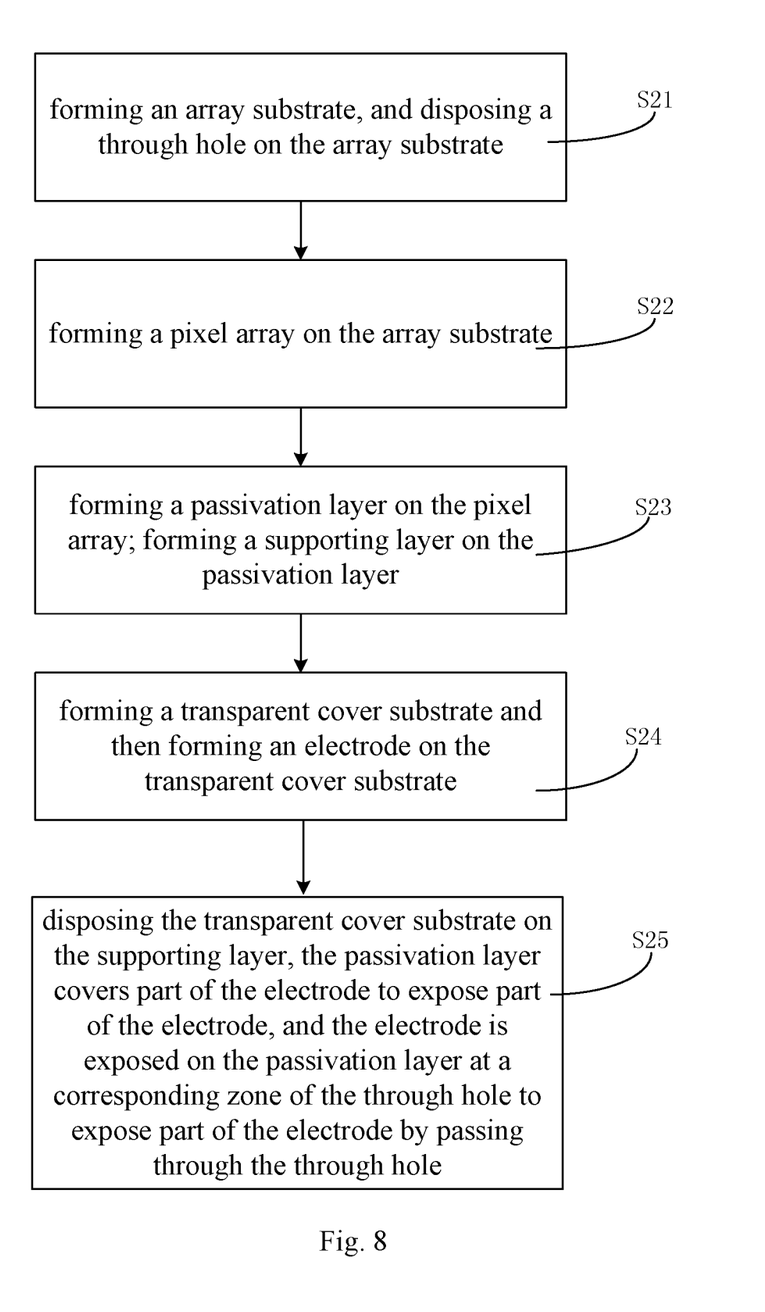
FIG. 8 is a flowchart of the second embodiment of a display panel manufacturing method of the invention.

Please refer to FIG. 8, FIG. 8 is a flowchart of the second embodiment of a display panel manufacturing method of the invention. In this embodiment, a manufacturing method of display panel comprises steps as following:

step S21: forming an array substrate, and disposing a through hole on the array substrate;
step S22: forming a pixel array on the array substrate;
step S23: forming a passivation layer on the pixel array; forming a supporting layer on the passivation layer;
step S24: forming a transparent cover substrate and then forming an electrode on the transparent cover substrate;
step S25: disposing the transparent cover substrate on the supporting layer, the passivation layer covers part of the electrode to expose part of the electrode, and the electrode is exposed on the passivation layer at a corresponding zone of the through hole to expose part of the electrode by passing through the through hole.

In steps S21~S25, both the array substrate 22 and the transparent cover substrate 21 are rectangular panels, and in other embodiments, both the array substrate 22 and the transparent cover substrate 21 can also be other shapes. Preferably, the array substrate 22 and the transparent cover substrate 21 are parallel, so that being largest areas disposed in parallel. After step S25 further comprises: disposing a first glue frame along an edge of the through hole and disposing a second glue frame along edges of the first substrate and the second substrate, and using both the first glue frame and the second glue frame to seal the first substrate and the second substrate for further forming a sealing structure of sealing the pixel array. After step S25 further comprises: disposing a functional component in the through hole which is electrically connected with the electrode. Preferably, the functional component is a speaker, a camera or a button. In other embodiments, the functional component can also be other accessories. Preferably, a size of any one direction along a plane of the array substrate 22 to the through hole 220 is smaller than one quarter of a size of the direction along the array substrate 12. Making a disposing size of the through hole 220 occupying a smaller ratio on the display panel to utilizing a space on the display panel reasonably.

Preferably, the through hole 220 is circular, the electrode 24 is strip and the amount is two which are parallel to each other, and each edge far from each two electrodes 24 are tangent to an inner edge of the through hole 220. Preferably, the closest distance between the edge of the through hole 220 and the edge of the array substrate 22 is smaller than one quarter of a width of the array substrate 22. Disposing the through hole 220 on the edge of the display panel, and then further arranging the space on the display panel reasonably. Preferably, a thickness of the passivation layer 25 is larger than a thickness of the pixel array 23. Make the thickness of the passivation layer 25 larger than the thickness of the pixel array 23 to reduce capacitive coupling effects.

The situation is different from the prior art that an electrode is disposed on a first substrate surface near the second substrate in the display panel of the invention, and a through hole is disposed corresponding to the second substrate and the electrode to expose part of the electrode by passing through the through hole, so that functional components can be disposed within the through hole and electrically connected to the electrode, and then achieving embedment of the display panel with functional components, furthermore save a disposing space, increase a screen portion of display panel, and then improve using experiences of users.

The above-description is embodiments of the invention only, but not for limiting the patent scope of the invention; therefore, any equivalent structural transformations or equivalent processes utilizing the present invention, or applications applied in other related technical field directly or indirectly are all included in the patent scope of the present invention.

The invention claimed is:

1. A display panel, wherein, the display panel comprises a first substrate and a second substrate disposing correspondingly to each other, a pixel array disposed between the first substrate and the second substrate and an electrode disposed on a first substrate surface near the second substrate, and a through hole is disposed correspondingly to the second substrate and the electrode to expose part of the electrode by passing through the through hole for disposing and electrically connecting functional components.

2. The display panel according to claim 1, wherein, the display panel further comprises a passivation layer, the passivation layer covers part of the electrode, and the electrode is exposed at a corresponding zone of the through hole.

3. The display panel according to claim 2, wherein, the first substrate is an array substrate, the second substrate is a transparent cover substrate, the passivation layer is disposed on the array substrate, and the pixel array is disposed on the passivation layer.

4. The display panel according to claim 2, wherein, the first substrate is a transparent cover substrate, the second substrate is an array substrate, the pixel array is disposed on the array substrate, and the passivation layer is disposed on the pixel array.

5. The display panel according to claim 4, wherein, the display panel further comprises a supporting layer for supporting between the passivation layer and the transparent cover substrate.

6. The display panel according to claim 1, wherein, the display panel further comprises a functional component, which disposed in the through hole and electrically connected with the electrode.

7. The display panel according to claim 6, wherein, the functional component is a speaker, a camera or a button.

8. The display panel according to claim 1, wherein, the display panel further comprises a first glue frame disposed along an edge of the through hole and a second glue frame disposed along edges of the first substrate and the second substrate, and both the first glue frame and the second glue frame used to sealing the first substrate and the second substrate are further forming a sealing structure for sealing the pixel array.

9. A manufacturing method of display panel, wherein, the manufacturing method comprises:
forming an electrode;
forming a passivation layer on a side of the electrode, and the passivation layer covers part of the electrode to expose part of the electrode;
forming an array substrate at another side of the electrode, and forming a pixel array on the passivation layer;
forming a transparent cover substrate on the pixel array, a through hole is disposed correspondingly to the electrode on the transparent cover substrate, and the electrode is exposed on the passivation layer at a corresponding zone of the through hole to expose part of the electrode by passing through the through hole for disposing and electrically connecting functional components.

10. A manufacturing method of display panel, wherein, the manufacturing method comprises:
forming an array substrate, and disposing a through hole on the array substrate;
forming a pixel array on the array substrate;
forming a passivation layer on the pixel array;
forming a supporting layer on the passivation layer;
forming a transparent cover substrate and then forming an electrode on the transparent cover substrate;
disposing the transparent cover substrate on the supporting layer, the passivation layer covers part of the electrode to expose part of the electrode, and the electrode is exposed on the passivation layer at a corresponding zone of the through hole to expose part of the electrode by passing through the through hole for disposing and electrically connecting functional components.

* * * * *